(12) United States Patent
Kawasaki

(10) Patent No.: US 8,587,094 B2
(45) Date of Patent: Nov. 19, 2013

(54) SEMICONDUCTOR DEVICE USING A COMPOUND SEMICONDUCTOR SUBTRATE

(75) Inventor: Hisao Kawasaki, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/115,251

(22) Filed: May 25, 2011

(65) Prior Publication Data

US 2011/0221036 A1    Sep. 15, 2011

Related U.S. Application Data

(62) Division of application No. 12/045,482, filed on Mar. 10, 2008, now abandoned.

(30) Foreign Application Priority Data

Mar. 19, 2007 (JP) ................................. 2007-070053

(51) Int. Cl.
*H01L 29/66* (2006.01)

(52) U.S. Cl.
USPC ........... 257/656; 257/482; 257/528; 257/532; 257/601; 257/E27.016; 257/E27.017; 257/E27.019; 257/E27.02; 257/E27.021; 257/E27.022; 257/E27.023; 257/E27.024; 257/E27.03; 257/E27.031; 257/E27.032; 257/E27.033; 257/E21.351; 257/E21.361

(58) Field of Classification Search
USPC .......... 257/482, 601, 528, 532, 656, E27.016, 257/E27.017, E27.019, E27.02, E27.021, 257/E27.022, E27.023, E27.024, E27.03, 257/E27.031, E27.032, E27.033, E21.351, 257/E21.361
See application file for complete search history.

(56) References Cited

U.S. PATENT DOCUMENTS

| | | | |
|---|---|---|---|
| 4,789,645 A | 12/1988 | Calviello et al. | |
| 4,959,705 A | 9/1990 | Lemnios et al. | |
| 5,162,258 A | 11/1992 | Lemnios et al. | |
| 5,225,706 A * | 7/1993 | Berger et al. | 257/446 |
| 5,272,370 A * | 12/1993 | French | 257/353 |

(Continued)

FOREIGN PATENT DOCUMENTS

| | | |
|---|---|---|
| JP | 1-264250 | 10/1989 |
| JP | 3-76262 | 4/1991 |

(Continued)

OTHER PUBLICATIONS

Office Action mailed Jun. 4, 2010, in co-pending U.S. Appl. No. 12/045,304.

(Continued)

*Primary Examiner* — Kenneth Parker
*Assistant Examiner* — David Chen
(74) *Attorney, Agent, or Firm* — Oblon, Spivak, McClelland, Maier & Neustadt, L.L.P.

(57) ABSTRACT

A semiconductor device having an active element and an MIM capacitor and a structure capable of reducing the number of the manufacturing steps thereof and a manufacturing method therefor are provided. The semiconductor device has a structure that the active element having an ohmic electrode and the MIM capacitor having a dielectric layer arranged between a lower electrode and an upper electrode are formed on a semiconductor substrate, wherein the lower electrode and ohmic electrode have the same structure. In an MMIC 100 in which an FET as an active element and the MIM capacitor are formed on a GaAs substrate 10, for example, a source electrode 16a and a drain electrode 16b, which are ohmic electrodes of the FET, are manufactured simultaneously with a lower electrode 16c of the MIM capacitor. Here the electrodes are formed with the same metal.

4 Claims, 5 Drawing Sheets

(56) References Cited

U.S. PATENT DOCUMENTS

| | | | |
|---|---|---|---|
| 5,382,821 A | 1/1995 | Nakajima | |
| 5,552,335 A | 9/1996 | Mahon et al. | |
| 5,712,504 A * | 1/1998 | Yano et al. | 257/452 |
| 5,714,410 A | 2/1998 | Kim | |
| 5,882,946 A | 3/1999 | Otani | |
| 6,075,266 A | 6/2000 | Yoshitomi | |
| 6,246,084 B1 | 6/2001 | Kim | |
| 6,420,739 B1 * | 7/2002 | Yokoi | 257/289 |
| 6,762,109 B2 | 7/2004 | Murata | |
| 2004/0022025 A1 | 2/2004 | Yokogawa et al. | |
| 2005/0040430 A1 | 2/2005 | Ahrens et al. | |
| 2005/0127393 A1 | 6/2005 | Kurokawa | |
| 2005/0162881 A1 * | 7/2005 | Stasiak et al. | 365/63 |

FOREIGN PATENT DOCUMENTS

| | | |
|---|---|---|
| JP | 3-225861 | 10/1991 |
| JP | 8-340083 | 12/1996 |
| JP | 9-102585 | 4/1997 |
| JP | 10-50720 | 2/1998 |
| JP | 10-247721 | 9/1998 |
| JP | 11-330378 | 11/1999 |
| JP | 2001-15693 | 1/2001 |
| JP | 2001-24155 | 1/2001 |
| JP | 2002-184946 | 6/2002 |
| JP | 2003-124234 | 4/2003 |
| WO | WO 03/050885 A2 | 6/2003 |

OTHER PUBLICATIONS

"Self-Aligned Dummry Gate Sidewall-Spaced MESFET", IBM Technical Disclosure Bulletin, vol. 28, Issue 7, Dec. 1985, pp. 2767-2768.

Office Action issued Mar. 16, 2010 in Japanese Application No. 2007-070052.

* cited by examiner

SEMICONDUCTOR DEVICE USING A COMPOUND SEMICONDUCTOR SUBTRATE

CROSS-REFERENCE TO RELATED APPLICATIONS

This application is a Division of and claims the benefit of priority under 35 U.S.C. §120 from U.S. Ser. No. 12/045,482, filed Mar. 10, 2008, and claims the benefit of priority from the prior Japanese Patent Application No. 2007-70053, filed on Mar. 19, 2007; the entire contents of which are incorporated herein by reference.

TECHNICAL FIELD

The present invention relates to a microwave monolithic integrated circuit (hereinafter, abbreviated as MMIC) using a compound semiconductor substrate and more particular to a semiconductor device having an active element and a metal-insulator-metal (hereinafter, abbreviated as MIM) capacitor and to a manufacturing method therefore.

BACKGROUND ART

In the microwave monolithic integrated circuit using a compound semiconductor substrate, conventionally, on the same compound semiconductor substrate such as GaAs, an active element such as a field effect transistor (hereinafter, abbreviated as an FET) and an MIM capacitor as a passive element are formed. (Refer to FIG. 1, Japanese Patent Application 2002-184946).

In conventional processes for manufacturing such an MMIC, the active element and passive element are manufactured by different manufacturing processes. For example, in the processes for manufacturing FET as an active element, a source electrode and a drain electrode composed of an ohmic metal AuGe/Au respectively are formed and a gate electrode composed of a Schottky metal Ti/Pt/Au is formed between these electrodes in an active area on a GaAs substrate.

On the other hand, in the MIM capacitor, a lower electrode composed of an Al or Ti/Al metal film is formed on the GaAs substrate and a dielectric layer composed of an SiN film, for example, is formed on the lower electrode. The SiN film is formed also on a surface of the FET. Then, an upper electrode composed of Ti/Pt/Au, for example, is formed on the SiN film. Upper electrodes are formed also on the surfaces of the source, drain and gate electrodes of the FET via contact holes formed in the SiN film. Thus the MMIC is completed.

However, in the MMIC having such structure as mentioned above, the step for forming the lower electrode of the MIM capacitor is carried out as a separate step from the step for forming the FET elements. Thus, the whole manufacturing steps become longer, resulting in low throughput. The reason why the manufacturing steps of the two must be different from each other is that the lower electrode of the MIM capacitor and the electrodes of the FET must be formed by different metallic materials. Therefore, a semiconductor device is desired, which realizes short manufacturing steps and enhances reliability of active and passive element portions.

One of the objects of the present invention is to provide an element structure of the MMIC having the active element and MIM capacitor enabling a reduction in the number of the manufacturing steps of the MMIC and also to provide a manufacturing method therefor.

DISCLOSURE OF THE INVENTION

According to a first aspect of the present invention, a semiconductor device including an active element having an ohmic electrode and an MIM capacitor having a dielectric layer arranged between a lower electrode and an upper electrode is provided on a semiconductor substrate, wherein the lower electrode has substantially the same structure as that of the ohmic electrode.

According to a second aspect of the present invention, a method for manufacturing a semiconductor device is provided, including steps of forming an active element having an ohmic electrode, forming an MIM capacitor having a dielectric layer arranged between a lower electrode and an upper electrode on the semiconductor substrate, thereby the lower electrode being manufactured simultaneously with the ohmic electrode.

As an active element, a PIN diode and a field effect transistor (FET) may be cited. The lower electrode of the MIM capacitor may have the same structure as that of an n-type ohmic electrode or a p-type ohmic electrode, when the active element is a PIN diode. That is, an electrode structure composed of a single layer made of the same metallic material or a plurality of laminated layers. Further, the lower electrode of the MIM capacitor may have the same structure as that of the source electrode or drain electrode of the FET when the active element is a FET.

According to the present invention, the lower electrode of the MIM capacitor can be formed simultaneously with the ohmic electrode of the active element, so that the number of the manufacturing steps are reduced and the throughput is improved.

DETAILED DESCRIPTION OF THE INVENTION

Figure 1:
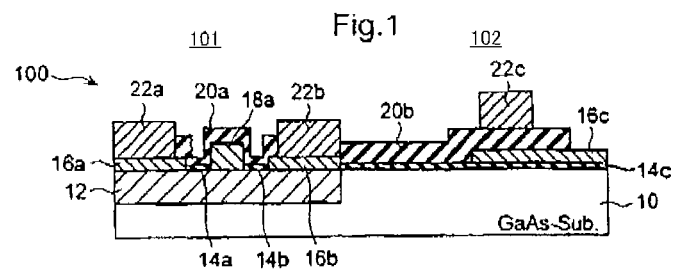
FIG. 1 is a schematic cross sectional view of the MMIC according to an embodiment of the present invention.

Hereinafter, the embodiments of the present invention will be explained in detail with reference to the accompanied drawings. The schematic cross sectional view of the MMIC according to a first embodiment is shown in FIG. 1. An MMIC 100 has a structure that an FET element portion 101 as an active element portion and an MIM capacitor portion 102 are formed on a GaAs substrate 10 which is a compound semiconductor substrate.

The FET element portion 101 is formed on an active layer (channel layer) 12 formed on the GaAs substrate 10. Namely, a pair of insulating films 14a and 14b is formed at a predetermined interval on the active layer 12. A source electrode 16a and a drain electrode 16b are formed on both sides of the pair of insulating films 14a and 14b on the active layer 12. Further, a gate electrode 18a is formed between the pair of insulating films 14a and 14b on the active layer 12. A surface protective film 20a is provided to cover surfaces of the pair of insulating films 14a and 14b, gate electrode 18a, a part of the source electrode 16a and a part of the drain electrode 16b. Upper electrodes 22a and 22b are formed on portions on the source electrode 16a and drain electrode 16b, where is not covered by the surface protective film 20a.

Further, the MIM capacitor portion 102 is formed on an insulating film 14c formed on the GaAs substrate 10. In a predetermined area on the insulating film 14c, a lower electrode 16c is formed. A dielectric layer 20b is formed on the insulating film 14c to cover the area where the lower electrode 16c is not formed and a predetermined area of the lower electrode 16c. An upper electrode 22c is formed on the dielectric layer 20b so as to hold the dielectric layer 20b between it and the lower electrode 16c.

The manufacturing method for the MMIC 100 having such a structure will be explained by referring to FIGS. 2A to 2H which show the manufacturing steps. Firstly, an insulating film 14 is formed uniformly on the active layer 12 provided on the GaAs substrate 10. Openings are formed in the insulating film at portions where the source electrode 16a and drain electrode 16b of the FET element portion are formed by removing the insulating film by etching. Thus, the insulating film is divided into an insulating film 14a formed in the FET element portion and an insulating film 14c formed in the MIM capacitor portion.

Further, the insulating layer 14c is provided to separate the lower electrode 16c of the MIM capacitor portion from the GaAs substrate 10, so as to prevent a leak current between them and a reduction in withstand voltage. Therefore, when such a leak current does not influence the characteristics of the MMIC 100, the insulation film 14c is not always necessary. Here, the insulating films 14a to 14c may be formed using the lift-off method depending on the material used for the insulating film 14a to 14c.

Figure 2A:
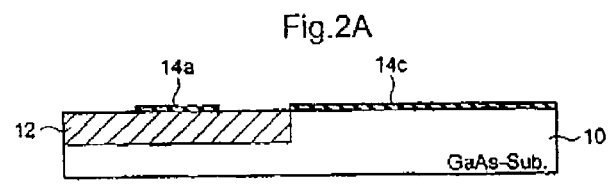
FIG. 2A is a diagram showing a first step of the manufacturing method for the MMIC shown in FIG. 1.
Figure 2B:
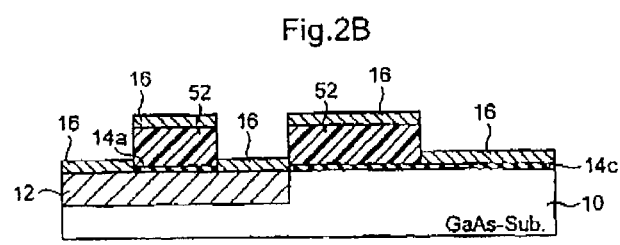
FIG. 2B is a diagram showing a second step of the manufacturing method for the MMIC shown in FIG. 1.

Then, a resist film 52 is formed at portions where the area for forming the source electrode and drain electrode is opened as shown in FIG. 2B. The resist film 52 is formed by coating a resist film all over the surface of the substrate 10 and then using a photolithographic technology including steps of exposing and developing using a mask pattern. Thereafter, a metal film 16 for ohmic contact is deposited over the entire surface. AuGe/Au is preferably used as a metal film 16.

Figure 2C:
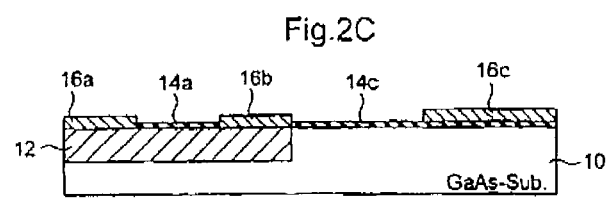
FIG. 2C is a diagram showing a third step of the manufacturing method for the MMIC shown in FIG. 1.

The resist film 52 and the metal film 16 on the resist film 52 are then removed by the lift-off method, as shown in FIG. 2C. Then, heat treatment (alloying) is performed so as to permit the metal film 16 to make ohmic contact with the active layer 12. Thus, the source electrode 16a and the drain electrode 16b, which are positioned on both sides of the insulating films 14a and 14b, are simultaneously formed with the lower electrode 16c in the MIM capacitor portion.

As mentioned above, the source 16a and the drain electrode 16b, which are ohmic electrodes of the FET element portion, and the lower electrode 16c of the MIM capacitor portion are formed simultaneously, thereby decreasing the number of the manufacturing steps.

Due to the heat treatment for obtaining the ohmic electrodes, there is a fear that surface roughness of the ohmic electrodes and deformation of the edge portion may be caused. Such a change in a shape is related deeply to the heat treatment temperature, in such a manner that the surface becomes rough and the edge portion is more deformed as the temperature rises.

The surface roughness of the lower electrode 16c and deformation of the edge portion cause a reduction in the reliability of the MIM capacitor, so that it is preferable to maintain the shape, which used to be before the heat treatment is performed as far as possible. From such a viewpoint, the heat treatment temperature is preferably controlled to 400° C. or lower, thereby satisfactorily keeping the shape before the heat treatment is performed. Further, the lower limit of the heat treatment temperature for alloying depends on the kind of metal composing the ohmic electrode.

Figure 2D:
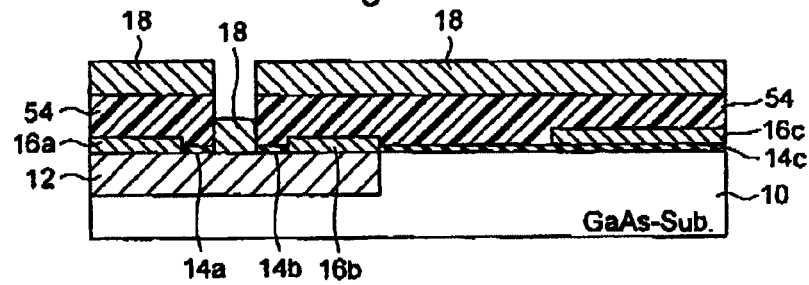
FIG. 2D is a diagram showing a fourth step of the manufacturing method for the MMIC shown in FIG. 1.
Figure 2E:
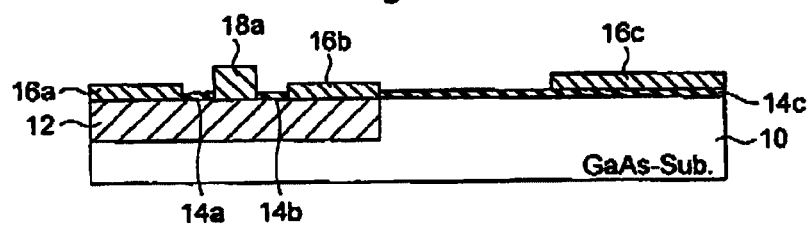
FIG. 2E is a diagram showing a fifth step of the manufacturing method for the MMIC shown in FIG. 1.

Then, the resist film 54 is provided, in which a portion where the gate electrode 18a is opened. Using the resist film 54 as an etching mask, exposed portion of the insulating film 14a is removed by RIE etching, for example. Thereafter, the metal film 18 composed by Ti/Pt/Au, for example, is deposited over the entire surface as shown in FIG. 2D. Then, the resist film 54 and the metal film 18 thereon are removed by the lift-off method, and thus the gate electrode 18a is formed as shown in FIG. 2E.

Figure 2F:
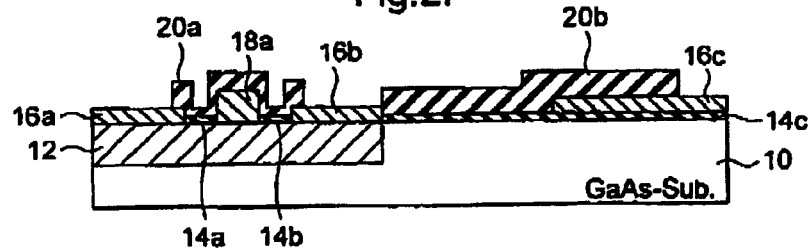
FIG. 2F is a diagram showing a sixth step of the manufacturing method for the MMIC shown in FIG. 1.

Next, as shown in FIG. 2F, the surface protective film 20a and dielectric layer 20b an be simultaneously formed respectively on the FET element portion and MIM capacitor portion, for example, by steps of laminating an SiN film on the entire surface, forming an etching mask with a resist layer, for example, with a predetermined pattern, forming contact holes for forming the source electrode 16a and the drain electrode 16b of the FET element portion and a contact hole (not drawn) of the gate electrode 18a on the SiN film by etching, and removing the etching mask. The surface protective film 20a of the FET element portion and the dielectric layer 20b of the MIM capacitor portion can be formed simultaneously, so that the number of the manufacturing steps can be reduced.

Figure 2G:
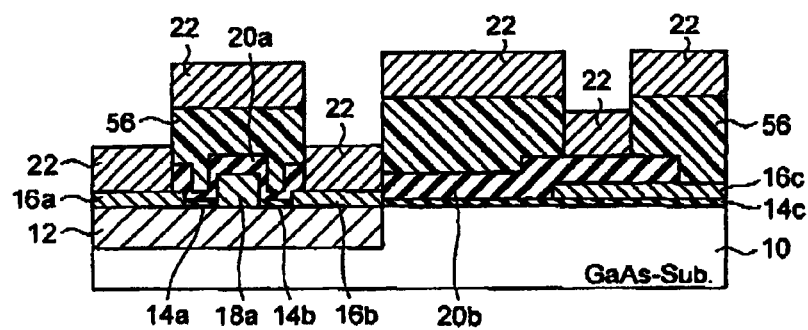
FIG. 2G is a diagram showing a seventh step of the manufacturing method for the MMIC shown in FIG. 1.

Thereafter, as shown in FIG. 2G, a resist film 56 is coated over entire surface except for a part of the surfaces of the source electrode 16a and drain electrode 16b, a part (not drawn) of the surface of the gate electrode 18a, a predetermined area of the dielectric layer 20b on the lower electrode 16c and a part (not drawn) of the surface of the lower electrode 16c. A metal film 22 composed of Ti/Pt/Au, for example, is deposited over the entire surface. Here, in the MIM capacitor portion, the Ti layer is formed on the dielectric layer 20b, so that high adhesion can be obtained between them.

Thereafter, the resist film 56 and metal film 22 formed thereon are removed by the lift-off method. As a result, the MMIC 100 shown in FIG. 1 is completed by forming the upper electrodes 22a and 22b of the drain electrode 16a and source electrode 16b respectively, the upper electrode (not drawn) of the gate electrode 18a, the upper electrode 22c and metallic wires (not drawn) connected to lower electrode 16c of the MIM capacitor which are shown in FIG. 1.

Figure 3:
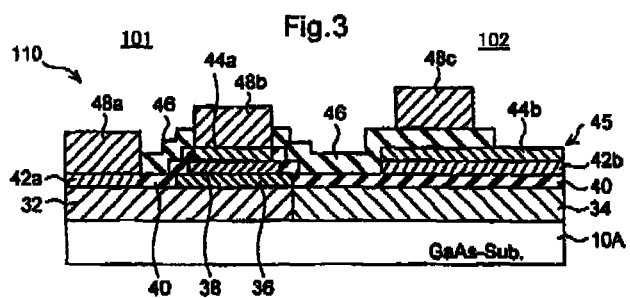
FIG. 3 is a schematic cross sectional view of the MMIC according to a second embodiment of the present invention.

Next, the schematic cross sectional view of the MMIC according to a second embodiment is shown in FIG. 3. In an MMIC 110, the PIN diode portion 101 as an active element portion and the MIM capacitor portion 102 are formed on a GaAs substrate 10A of the semi-insulating semiconductor substrate.

The PIN diode portion 101 includes an n-type semiconductor layer 32 formed on the GaAs substrate 10A, a high-resistance semiconductor layer 36 formed on the n-type semiconductor layer 32, a p-type semiconductor layer 38 formed on the high-resistance semiconductor layer 36, an insulating layer 40, an n-type ohmic electrode 42a formed on the n-type semiconductor layer 32, a p-type ohmic electrode 44a formed on the p-type semiconductor layer 38, an upper electrode 48a formed on the n-type ohmic electrode 42a, and an upper electrode 48b formed on the p-type ohmic electrode 44a.

The MIM capacitor portion 102 includes a highly-resistant layer 34 formed on the GaAs substrate 10A, the insulating film 40 formed on the highly-resistant layer 34, a lower electrode 45 formed on the insulating film 40, a dielectric layer 46 formed on the lower electrode 45, and an upper electrode 48c formed on the dielectric layer 46. The lower electrode 45 has a two-layer structure composed of a lower layer portion 42b and an upper layer portion 44b.

A method for manufacturing the MMIC 100 having a structure described will be explained by referring to FIGS. 4A to 4G which are diagrams showing manufacturing steps.

Figure 4A:
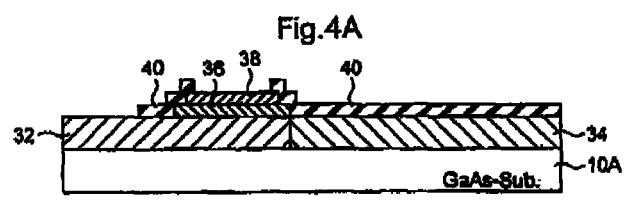
FIG. 4A is a diagram showing a first step of the manufacturing method of the MMIC shown in FIG. 3.

Firstly, as shown in FIG. 4A, the n-type semiconductor layer 32, the high-resistance semiconductor layer 36 and the p-type semiconductor layer 38 are laminated on the GaAs substrate 10A. Unnecessary portions are removed from the high-resistance semiconductor layer 36 and the p-type semiconductor layer 38 by mesa-etching. A high resistance layer 34 is formed on the n-type semiconductor layer 32 other than the PIN diode portion using an ion injection isolation method. The insulating film 40 is formed on the entire surface.

In the insulating film 40, the portions where the electrode is formed on the n-type semiconductor layer 32 and on the p-type semiconductor layer 38 are removed, for example, by the etching process using a resist film as an etching mask. Further, the insulating film 40 is formed in the MIM capacitor portion in order to prevent a leak current flowing through the lower electrode 45 and to reduce the withstand voltage of the MIM capacitor.

Figure 4B:
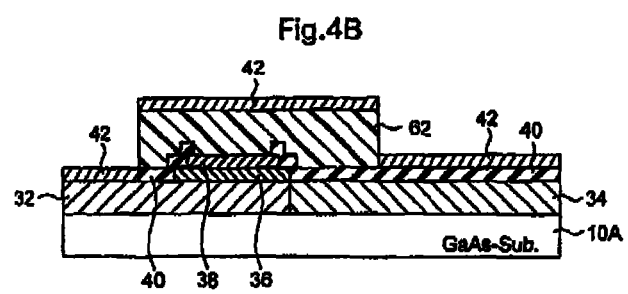
FIG. 4B is a diagram showing a second step of the manufacturing method for the MMIC shown in FIG. 3.
Figure 4C:
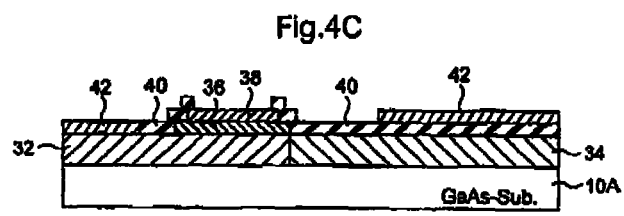
FIG. 4C is a diagram showing a third step of the manufacturing method for the MMIC shown in FIG. 3.

Then, as shown in FIG. 4B, a resist film 62 is formed having openings at portions on the n-type semiconductor layer 32 and on a part of the MIM capacitor. Then a metal film 42 composed of AuGe/Au, for example, enabling ohmic contact is deposited on the entire surface. Thereafter, the resist film 62 and the metal film 42 on the resist film 42 are removed by the lift-off method as shown in FIG. 4C.

Figure 4D:
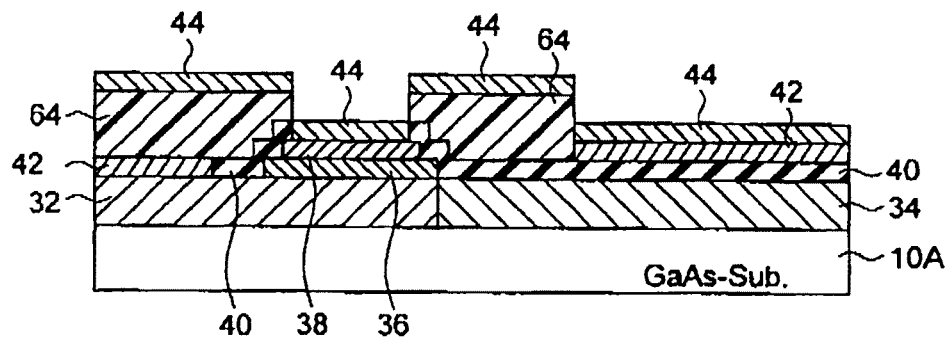
FIG. 4D is a diagram showing a fourth step diagram of the manufacturing method for the MMIC shown in FIG. 3.

Next, as shown in FIG. 4D, a resist film 64 is formed, having openings at a part of the p-type semiconductor layer 38 and at a portion where the metal film 42 of the MIM capacitor portion is formed. Then a metal film 44 composed of AuZn, for example, enabling the ohmic contact is deposited on the entire surface.

Figure 4E:
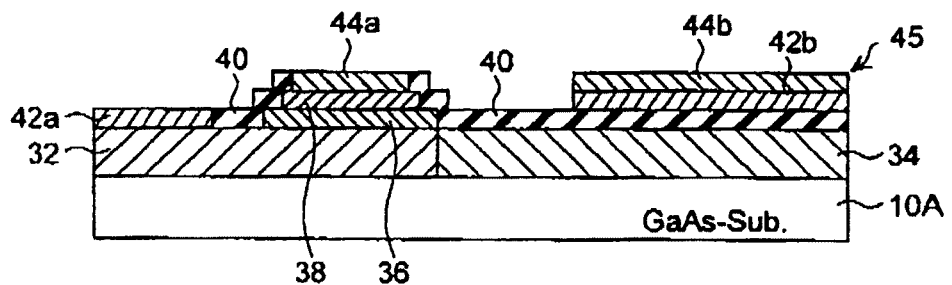
FIG. 4E is a diagram showing a fifth step of the manufacturing method for the MMIC shown in FIG. 3.

Thereafter, the resist film 64 and the metal film 44 on the resist film 64 are removed by the lift-off method as shown in FIG. 4E.

In the state that the metal film 42, the metal film 44 and the metal films 42 and 44 respectively remain on the n-type semiconductor layer 32, on the p-type semiconductor layer 38 and on the insulating film 40, the heat treatment for alloying is performed so as to permit the metal films 42 and 44 to make ohmic contact with the underlying substrates. The heat treatment temperature is set at 400° C. or lower, similar to the case of the MMIC 100 explained previously. Thus the reliability of the MIM capacitor can be enhanced.

With the heat treatment, the metal film 42 on the n-type semiconductor layer 32 is changed to the n-type ohmic electrode 42a, and the metal film 44 on the p-type semiconductor layer 38 is changed to the p-type ohmic electrode 44a. The metal films 42 and 44 on the insulating film 40 are also changed to the lower electrode 45 of the MIM capacitor. The lower electrode 45 has a two-layer structure having the lower layer portion 42b composed of the metal film 42 and the upper layer portion 44b composed of the metal film 44. Needless to say, the lower layer portion 42b has the same structure as that of the n-type ohmic electrode 42a and the upper layer portion 44b has the same structure as that of the p-type ohmic electrode 44a.

When the ohmic electrodes 42a and 44a of the PIN diode portion and the lower electrode 45 of the MIM capacitor are thus formed simultaneously, the number of the manufacturing steps are reduced. Further, the lower electrode 45 is composed of an ohmic contact metal film of both n-type and p-type semiconductors, so that the sheet resistance of the lower electrode 45 can be lowered.

The heat treatment of alloying for obtaining such an ohmic electrode can be performed respectively after removal of the resist film 62 as shown in FIG. 4C and after removal of the resist film 64 as shown in FIG. 4E. In this case, the first heat treatment temperature is preferably selected higher than the next heat treatment temperature. It is possible to set such heat treatment temperature by selecting the composition of the metal films 42 and 44.

Further, at the step shown in FIG. 4B in the manufacturing steps aforementioned, the lower electrode 45 is composed of only the upper layer portion 44b which is a p-type ohmic electrode when the resist film 62 is formed to cover the lower electrode area of the MIM capacitor. On the other hand, at the step shown in FIG. 4D in the manufacturing steps aforementioned, the lower electrode 45 is composed of only the lower layer portion 42b which is an n-type ohmic electrode when the resist film 62 is formed to cover the metal film 42 remaining on the MIM capacitor portion. Such an electrode structure can be adopted, as long as the resistance of the lower electrode 45 can be controlled to its allowable magnitude, for example, when the metal films 42 and 44 are made thicker.

Figure 4F:
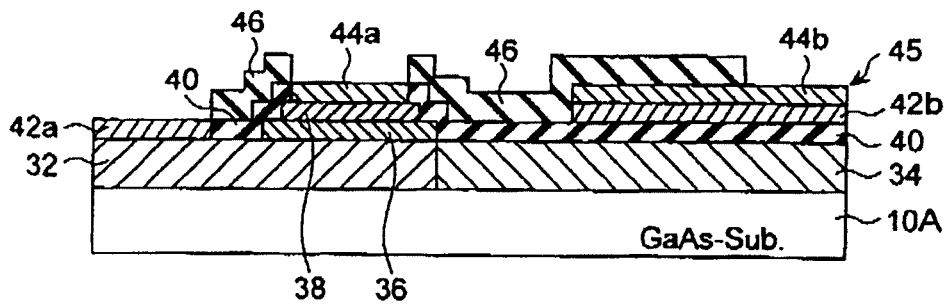
FIG. 4F is a diagram showing a sixth step of the manufacturing method for the MMIC shown in FIG. 3.

After the PIN diode is completed in this way, as shown in FIG. 4F, the dielectric layer 46 composed of a SiN film, for example, is provided by forming the SiN film on the entire surface, forming an etching mask composed of a resist film having a predetermined pattern on the SiN film, forming a contact holes on the SiN film by etching and removing the etching mask. The contact holes are formed on the n-type ohmic electrode 42a, on the p-type ohmic electrode 44a and on the lower electrode 45 for connecting a metallic wire (not drawn) to the lower electrode 45.

Figure 4G:
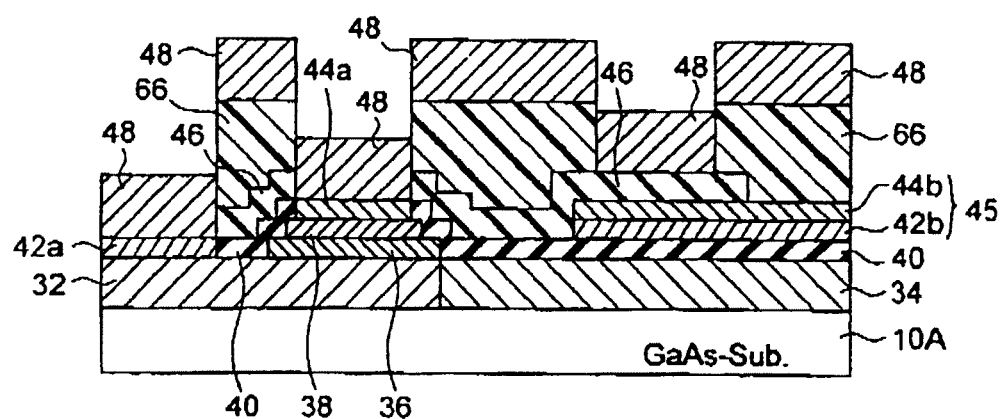
FIG. 4G is a diagram showing a seventh step of the manufacturing method for the MMIC shown in FIG. 3.

Thereafter, as shown in FIG. 4G, a resist film 66 is formed having openings on the tops of the n-type ohmic electrode 42a, the p-type ohmic electrode 44a and on a part of the dielectric layer 46. Then, a metal film 48 composed of Ti/Pt/Au, for example, is deposited on the entire surface via the resist film 66.

Finally, the resist film 66 is removed by the lift-off method. Thus the upper electrode 48a connected to the n-type ohmic electrode 42a, the upper electrode 48b connected to the p-type ohmic electrode 44a and the upper electrode 48c of the MIM capacitor are formed, thereby completing the MMIC 110.

As mentioned above, the ohmic electrode composing the active element and the lower electrode composing the MIM capacitor can be formed simultaneously in the MMICs 100 and 110, so that there is no need to manufacture the active element and MIM capacitor in the different manufacturing steps from each other. Thus the number of the manufacturing steps can be reduced and the throughput is improved.

Further, the present invention is not limited to the embodiments aforementioned and can be modified and executed variously within a range not deviated from the objects of the present invention.

What is claimed is:

1. A semiconductor device using a compound semiconductor substrate comprising:
   a PIN diode including an n-type semiconductor layer formed on the compound semiconductor substrate;
   a first ohmic electrode formed on the n-type semiconductor layer;
   a high-resistance semiconductor layer formed on the n-type semiconductor layer;
   a p-type semiconductor layer formed on the high-resistance semiconductor layer;
   a second ohmic electrode formed on the p-type semiconductor layer; and
   a metal-insulator-metal (MIM) capacitor having a dielectric layer arranged between a lower electrode and an upper electrode provided on the compound semiconductor substrate, wherein the lower electrode has first layer of the same material as that of the first ohmic electrode and a second layer of the same material as that of the second ohmic electrode.

2. The semiconductor device according to claim 1, wherein an insulating film is formed between the compound semiconductor substrate and the lower electrode.

3. The semiconductor device according to claim 1, wherein the first ohmic electrode is made of AuGe/Au.

4. The semiconductor device according to claim 1, wherein the second ohmic electrode is made of AuZn.

* * * * *